(12) United States Patent
Sun et al.

(10) Patent No.: US 9,941,379 B2
(45) Date of Patent: Apr. 10, 2018

(54) SEMICONDUCTOR DEVICE AND MANUFACTURING METHOD THEREFOR

(71) Applicant: PixArt Imaging Incorporation, HsinChu (TW)

(72) Inventors: Chih-Ming Sun, HsinChu (TW); Hsin-Hui Hsu, HsinChu (TW); Ming-Han Tsai, HsinChu (TW)

(73) Assignee: PIXART IMAGING INCORPORATION, Hsin-Chu (TW)

( * ) Notice: Subject to any disclaimer, the term of this patent is extended or adjusted under 35 U.S.C. 154(b) by 145 days.

(21) Appl. No.: 15/068,573

(22) Filed: Mar. 12, 2016

(65) Prior Publication Data

US 2016/0365423 A1    Dec. 15, 2016

(30) Foreign Application Priority Data

Jun. 12, 2015 (TW) .............................. 104119183 A

(51) Int. Cl.
| | | |
|---|---|---|
| *H01L 21/308* | (2006.01) | |
| *H01L 21/311* | (2006.01) | |
| *H01L 21/762* | (2006.01) | |
| *H01L 29/51* | (2006.01) | |
| *H01L 29/40* | (2006.01) | |

(52) U.S. Cl.
CPC ........ *H01L 29/518* (2013.01); *H01L 21/3086* (2013.01); *H01L 21/76224* (2013.01); *H01L 29/401* (2013.01)

(58) Field of Classification Search
CPC ........... H01L 21/3086; H01L 21/76224; H01L 29/66636
See application file for complete search history.

(56) References Cited

U.S. PATENT DOCUMENTS

| | | | | |
|---|---|---|---|---|
| 2002/0039822 | A1* | 4/2002 | Kusumi | ............ H01L 21/28273 438/264 |
| 2006/0148220 | A1* | 7/2006 | Lindert | ............. H01L 21/26506 438/514 |
| 2011/0024850 | A1* | 2/2011 | Wang | .................. B81C 1/00182 257/415 |

* cited by examiner

*Primary Examiner* — Raj R Gupta
(74) *Attorney, Agent, or Firm* — Tung & Associates

(57) ABSTRACT

The present invention discloses a manufacturing method for a semiconductor device. The manufacturing method includes: providing a substrate; forming a semiconductor stacked structure on the substrate; forming at least apart of a stacked cap layer on the semiconductor stacked structure, wherein the part of the stacked cap layer includes a nitride layer; removing a part of the nitride layer; forming the rest part of the stacked cap layer; forming a protection layer on the stacked cap layer, and etching the protection layer to form an opening, wherein the nitride layer is not exposed by the opening; and introducing an etchant material into the opening to etch the substrate. The present invention also provides a semiconductor device made by the method.

7 Claims, 7 Drawing Sheets

SEMICONDUCTOR DEVICE AND MANUFACTURING METHOD THEREFOR

CROSS REFERENCE

The present invention claims priority to TW104119183, filed on Jun. 12, 2015.

BACKGROUND OF THE INVENTION

Field of Invention

The present invention relates to a semiconductor device and a manufacturing method therefor; particularly, it relates to such a semiconductor device which has a stacked cap layer, such that a nitride layer thereof is protected so as not to be damaged by an etchant material, and a manufacturing method therefor.

Description of Related Art

Please refer to FIGS. 1A-1B, which are cross-sectional views illustrating a conventional manufacturing method for a semiconductor device. As shown in FIG. 1A, in the manufacturing method for a conventional semiconductor device 10, a semiconductor stacked structure 19 is formed on a substrate 11. A stacked cap layer 15 is formed on the semiconductor stacked structure 19. The semiconductor stacked structure 19 includes a gate structure 13 and a spacer layer 14. The semiconductor stacked structure 19 is formed on the substrate 11 by the steps of: first, forming a shallow trench isolation (STI) structure 12 in the substrate 11; next, forming the gate structure 13 and the spacer layer 14 on the STI structure 12. As shown by the cross-sectional view of FIG. 1A, the gate structure 13 includes, from bottom to top: a first gate structure 131, a nitride dielectric layer 132, an oxide dielectric layer 133 and a second gate structure 134. The spacer layer 14 includes an oxide spacer layer 14b and a nitride spacer layer 14a. According to the cross-sectional view of FIG. 1A, the stacked cap layer 15 includes, from bottom to top, a first oxide cap layer 151, a nitride layer 152 and a second oxide cap layer 153. A protection layer 16 is formed on the stacked cap layer 15, wherein the protection layer 16 is etched to form an opening 161.

As shown in FIG. 1B, in the following steps for manufacturing the conventional semiconductor device 10, the substrate 11 is etched, and an etchant material (e.g., sulfur hexafluoride (SF6)) is introduced into the opening 161. Undesirably, because sulfur hexafluoride (SF6) would attack the nitride layer 152 of the stacked cap layer 15 (as shown by the arrow in FIG. 1B), the nitride layer 152 will be damaged, to adversely affect the robustness of the conventional semiconductor device 10 is affected.

In view of the above, to overcome the drawbacks in the prior art, the present invention proposes a manufacturing method for a semiconductor device having a stacked cap layer, wherein the nitride layer of the stacked cap layer is protected and not to be damaged by the etchant material.

SUMMARY OF THE INVENTION

From one perspective, the present invention provides a manufacturing method for a semiconductor device, comprising the following steps: providing a substrate; forming a semiconductor stacked structure on the substrate; forming at least a part of a stacked cap layer on the semiconductor stacked structure, wherein the part of the stacked cap layer includes a nitride layer; removing apart of the nitride layer; forming the rest part of the stacked cap layer; forming a protection layer on the stacked cap layer, and etching the protection layer to form an opening, wherein the nitride layer is not exposed by the opening; and introducing an etchant material into the opening to etch the substrate.

In one embodiment, the step of forming the semiconductor stacked structure on the substrate includes the sub-steps of: forming a shallow trench isolation (STI) structure on the substrate; and forming a gate structure and a spacer layer on the STI structure.

In one embodiment, the step of forming the gate structure includes the sub-steps of: forming a first gate structure on the STI structure; forming a nitride dielectric layer on the first gate structure; forming an oxide dielectric layer on the nitride dielectric layer; and forming a second gate structure on the oxide dielectric layer.

In one embodiment, the step of forming the spacer layer includes the sub-steps of: forming an oxide spacer layer outside a sidewall of the gate structure; and forming a nitride spacer layer outside a sidewall of the oxide spacer layer.

In one embodiment, the step of forming at least the part of the stacked cap layer on the semiconductor stacked structure includes the sub-steps of: forming a first oxide cap layer on the semiconductor stacked structure; and forming a nitride layer on the first oxide cap layer.

In one embodiment, the step of forming the rest part of the stacked cap layer includes the sub-step of: forming a second oxide cap layer on the rest part of the nitride layer.

In one embodiment, the etchant material includes sulfur hexafluoride (SF6) or xenon difluoride (XeF2).

From another perspective, the present invention provides a manufacturing method for a semiconductor device, comprising the steps of: providing a substrate; forming a semiconductor stacked structure on the substrate; forming a stacked cap layer on the semiconductor stacked structure, wherein the stacked cap layer includes a nitride layer; forming a protection layer on the stacked cap layer, and etching the protection layer to form an opening, wherein at least a part of the nitride layer is exposed by the opening; forming an oxide protection layer on a sidewall of the opening, to cover at least the part of the nitride layer; and introducing an etchant material into the opening to etch the substrate.

In one embodiment, the step of forming the stacked cap layer on the semiconductor stacked structure includes the sub-steps of: forming a first oxide cap layer on the semiconductor stacked structure; forming the nitride layer on the first oxide cap layer; and forming a second oxide cap layer on the nitride layer.

From yet another perspective, the present invention provides a semiconductor device, comprising: a substrate; a semiconductor stacked structure on the substrate; a stacked cap layer on the semiconductor stacked structure, wherein the stacked cap layer includes a first oxide cap layer, a nitride layer and a second oxide cap layer, wherein the nitride layer is between the first oxide cap layer and the second oxide cap layer; and a protection layer on the stacked cap layer, the protection layer having at least one opening, wherein a part of the first oxide cap layer and a part of the second oxide cap layer are exposed by the opening, while the nitride layer is not exposed by the opening.

The objectives, technical details, features, and effects of the present invention will be better understood with regard to the detailed description of the embodiments below, with reference to the attached drawings.

DESCRIPTION OF THE PREFERRED EMBODIMENTS

The above and other technical details, features and effects of the present invention will be better understood with regard to the detailed description of the embodiments below, with reference to the drawings. The drawings as referred to throughout the description of the present invention are for illustration only, to show the interrelations between the apparatus and devices, but not drawn according to actual scale.

Please refer to FIGS. 2A-2F, which are cross-sectional views illustrating a manufacturing method for a semiconductor device according to a first embodiment of the present invention. Note that this embodiment is meant to show the primary features of the present invention. Hence, the lithography process steps, the ion implantation process steps, as well as other process steps which are not relevant to the primary features of the present invention, are not explained in detail here because they are well known to those skilled in the art of semiconductor device manufacture.

Figure 2A:
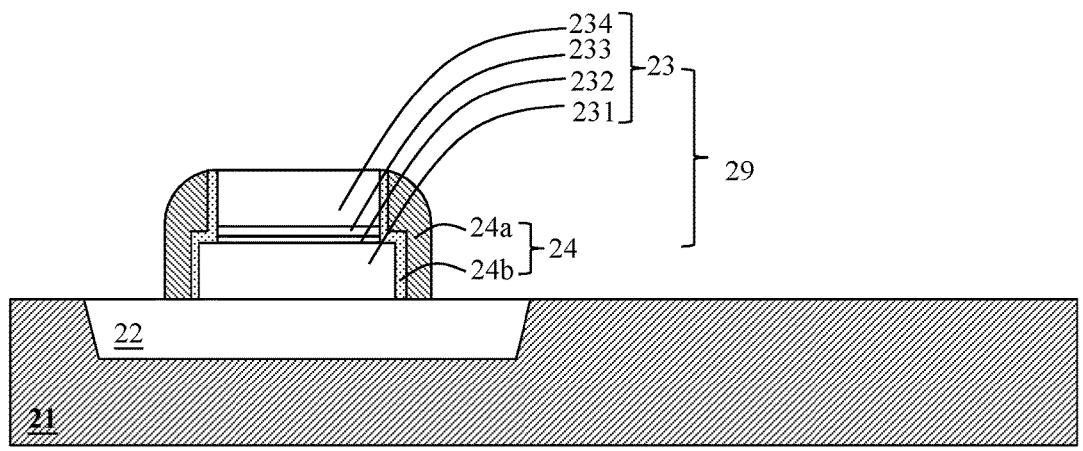
FIGS. 2A-2F depict cross-sectional views illustrating a manufacturing method for a semiconductor device according to a first embodiment of the present invention.

Referring to FIG. 2A, first, a substrate 21 is provided. A semiconductor stacked structure 29 is formed on the substrate 21. The semiconductor stacked structure 29 includes a gate structure 23 and a spacer layer 24. In one embodiment, the semiconductor stacked structure 29 is formed by: first, forming a shallow trench isolation (STI) structure 22 in the substrate 21; next, forming the gate structure 23 and the spacer layer 24 on the STI structure 22. In one embodiment, the substrate 21 for example can be, but is not limited to a P-type silicon substrate. In other embodiments, the substrate 21 can be any other type of semiconductor substrate. The STI structure 22 in this embodiment is a non-limiting example. In another embodiment, the STI structure 22 may be replaced by a local oxidation of silicon (LOCOS) structure and such LOCOS structure can be formed on the substrate 21 through an oxidation process. Various variations can be made under the spirit of the present invention, based on the above illustrative examples.

As shown by the cross-sectional view of FIG. 2A, the gate structure 23 includes, from bottom to top, a first gate structure 231, a nitride dielectric layer 232, an oxide dielectric layer 233 and a second gate structure 234. The first gate structure 231 is formed on the STI structure 22. The nitride dielectric layer 232 is formed on the first gate structure 231. The oxide dielectric layer 233 is formed on the nitride dielectric layer 232. The second gate structure 234 is formed on the oxide dielectric layer 233.

In this embodiment, the first gate structure 231 and the second gate structure 234 function as electrical contacts of the gate structure 23. The first gate structure 231 and the second gate structure 234 includes a conductive material, which can be for example but not limited to metal, or polysilicon doped with P-type or N-type impurities.

As shown by the cross-sectional view of FIG. 2A, the spacer layer 24 includes, from bottom to top, an oxide spacer layer 24b and a nitride spacer layer 24a. The oxide spacer layer 24b is formed outside a sidewall of the gate structure 23 and encloses such sidewall of the gate structure 23. The nitride spacer layer 24a is formed outside a sidewall of the oxide spacer layer 24b. The oxide spacer layer 24b and the nitride spacer layer 24a are examples of insulating materials.

Note that the present invention can be applied to different types of gate and spacer structures; i.e., the gate structure and the spacer layer of the present invention are not limited to the above-mentioned structures. For example, it is not necessary for the gate structure to include double gates, and it is not necessary for the spacer layer to include a complex double spacer layers.

Figure 2B:
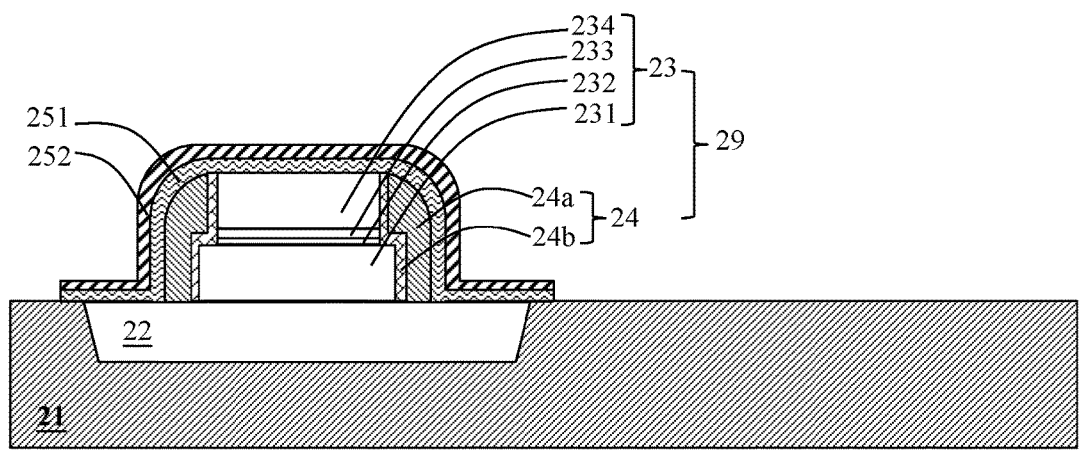

Next, as shown in FIG. 2B, at least a part of a stacked cap layer 25 is formed on the semiconductor stacked structure 29 (i.e., formed on the gate structure 23 and on the sidewall of the spacer layer 24). In this embodiment, the at least a part of the stacked cap layer 25 is formed by: first, forming a first oxide cap layer 251 on the semiconductor stacked structure 29 (i.e., on the gate structure 23 and on the sidewall of the spacer layer 24); next, forming a nitride layer 252 on the first oxide cap layer 251. That is, the "at least a part of the stacked cap layer 25" includes the nitride layer 252. In one embodiment, the nitride layer 252 can be made of a SixNy material.

Figure 2C:
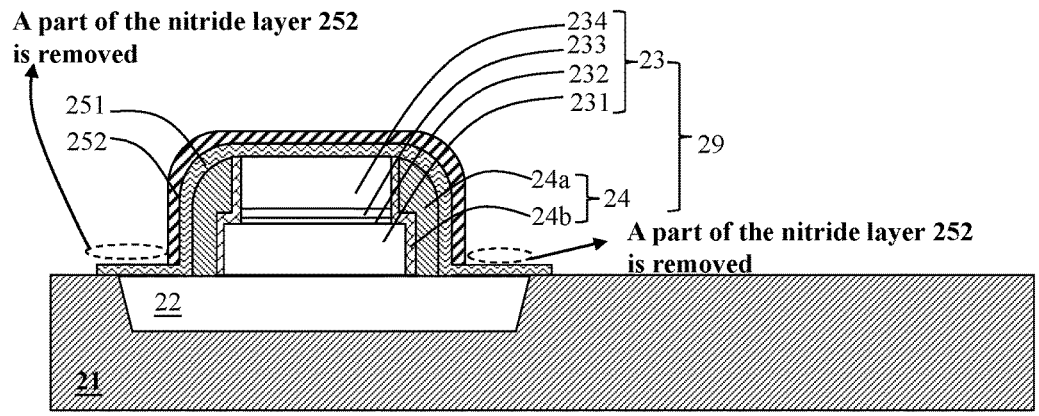

FIG. 2C shows an important feature of this embodiment. Before the stacked cap layer 25 is completely formed, a part of the nitride layer 252 is removed (as shown by the arrow in FIG. 2C). The feature of FIG. 2C can be accomplished by a lithography process and an etching process.

Figure 1A:
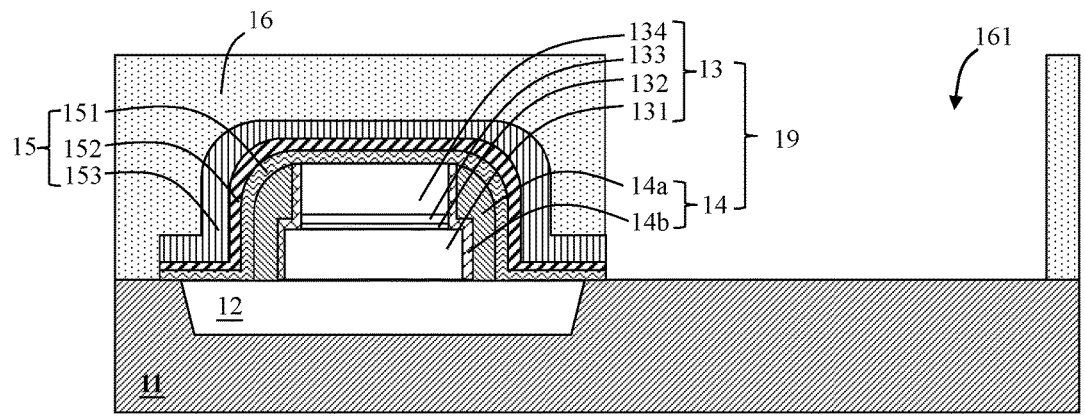
FIGS. 1A-1B depict cross-sectional views illustrating a conventional manufacturing method for a semiconductor device.
Figure 2D:
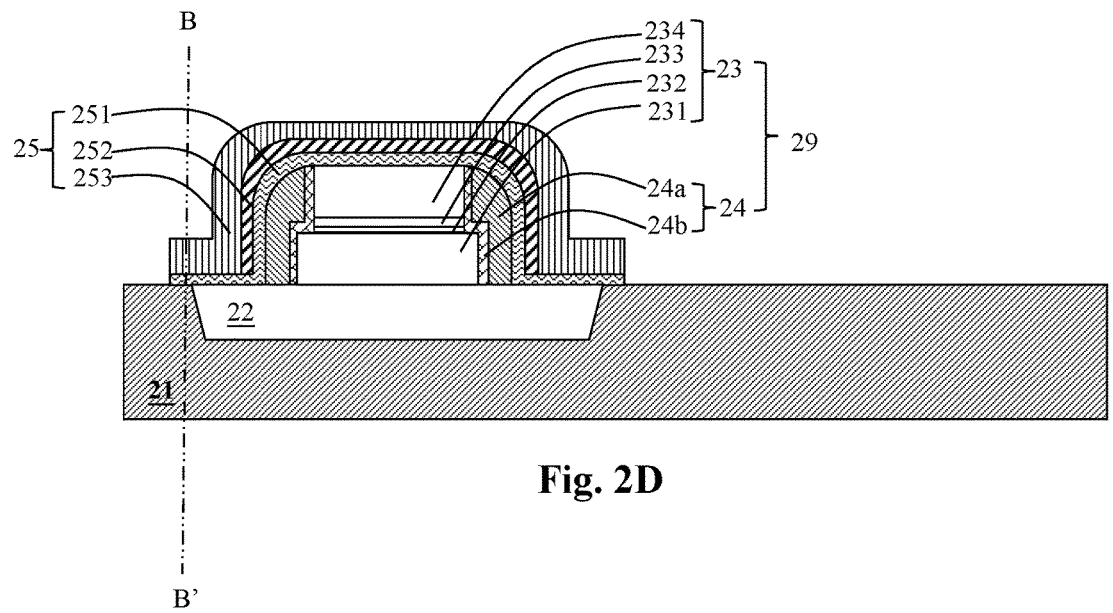

Next, as shown in FIG. 2D, a second oxide cap layer 253 is formed on the rest part of the nitride layer 252, to complete the stacked cap layer 25. Thus, the stacked cap layer 25 includes the first oxide cap layer 251, the rest part of the nitride layer 252 and the second oxide cap layer 253. Importantly, this embodiment is different from the prior art in that: in the prior art, along the line AA' of FIG. 1A, the stacked cap layer 15 includes, from bottom to top, the first oxide cap layer 151, the nitride layer 152 and the second oxide cap layer 153. In contrast, in this embodiment, along the line BB' of FIG. 2D, the stacked cap layer 15 includes, from bottom to top, the first oxide cap layer 251 and the second oxide cap layer 253. Note that at the position where the line BB' is located, there is no nitride layer 252.

Figure 2E:
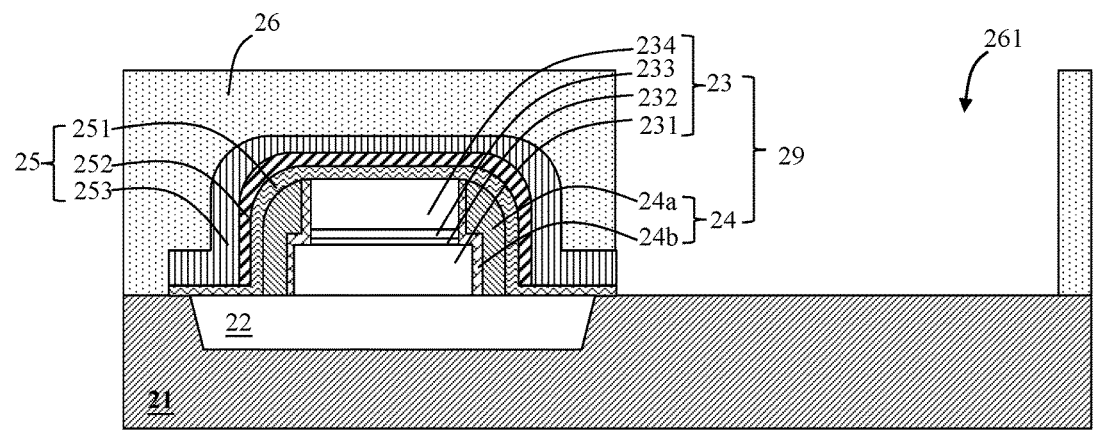

Next, as shown in FIG. 2E, a protection layer 26 is formed on the stacked cap layer 25, and the protection layer 26 is etched to form an opening 261. The protection layer 26 can be etched by dry etching, wet etching, isotropic etching or anisotropic etching. In this embodiment, the opening 261 is formed by anisotropic etching, for example but not limited to, an inductive coupling plasma (ICP) etching process.

Note that, in this embodiment, because a part of the nitride layer 252 is removed in the step of FIG. 2C, in FIG. 2E, the nitride layer 252 is not neighboring the opening 261. As a result, in this embodiment, the nitride layer 252 is not exposed by the opening 261.

Figure 2F:

Next, as shown in FIG. 2F, an etchant material is introduced into the opening 261. In this embodiment, the substrate 21 is etched by isotropic etching, to form the configuration as shown in FIG. 2F. Thus, a semiconductor device 20 having a stacked cap layer 25 is obtained. In this embodiment, the etchant material can be a gas material or a liquid material. For example, the etchant material can be sulfur hexafluoride (SF6) or xenon difluoride (XeF2).

Importantly, because the nitride layer 252 is not exposed by the opening 261, the rest part of the nitride layer 252 is protected and is not damaged by the etchant material. As a consequence, the entire structure of the semiconductor device 20 is intact and robust.

Please refer to FIGS. 3A-3E, which are cross-sectional views illustrating a manufacturing method for a semiconductor device according to a second embodiment of the present invention. Note that this embodiment is meant to show the primary features of the present invention. Hence, the lithography process steps, the ion implantation process steps, as well as other process steps which are not relevant to the primary features of the present invention, are not explained in detail here because they are well known to those skilled in the art of semiconductor device manufacture.

Referring to FIG. 2A, first, a substrate 21 is provided. A semiconductor stacked structure 29 is formed on the substrate 21. The semiconductor stacked structure 29 includes a gate structure 23 and a spacer layer 24. In one embodiment, the semiconductor stacked structure 29 is formed by: first, forming a shallow trench isolation (STI) structure 22 in the substrate 21; next, forming the gate structure 23 and the spacer layer 24 on the STI structure 22. The substrate 21, the STI structure 22, the gate structure 23 and the spacer layer 24 of this embodiment are similar to those of the first embodiment, so their details are not redundantly explained here.

Figure 3A:
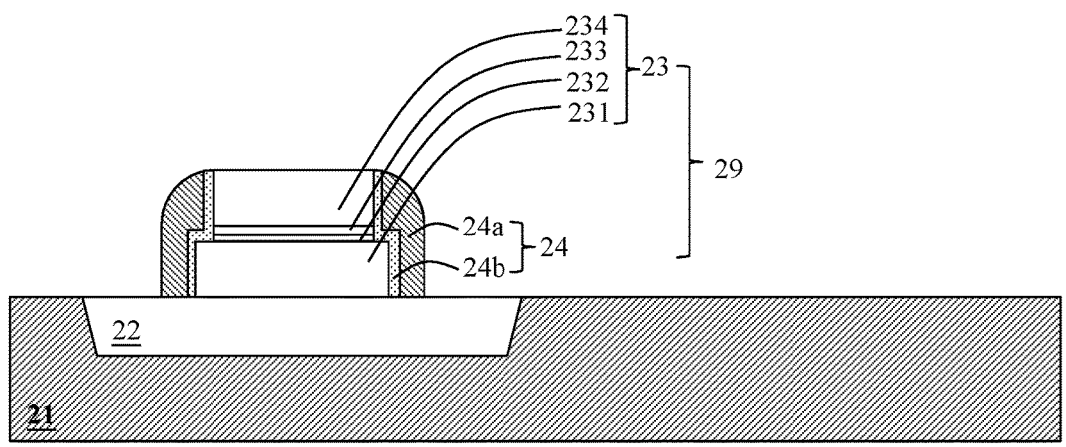
FIGS. 3A-3E depict cross-sectional views illustrating a manufacturing method for a semiconductor device according to a second embodiment of the present invention.
Figure 3B:
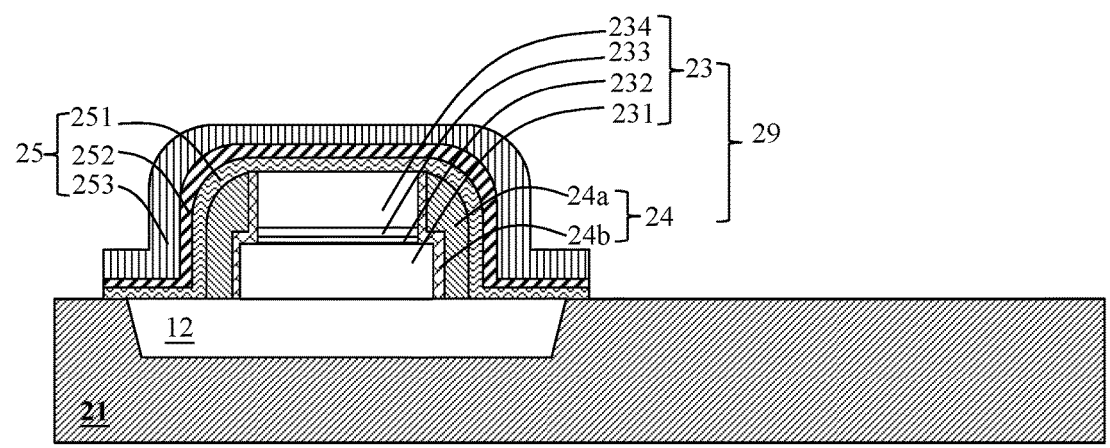

Next, as shown in FIG. 3B, all parts of the stacked cap layer 25 is formed on the semiconductor stacked structure 29 (i.e., formed on the gate structure 23 and on the sidewall of the spacer layer 24). In this embodiment, forming all parts of the stacked cap layer 25 includes the following steps: first, forming a first oxide cap layer 251 on the semiconductor stacked structure 29 (i.e., on the gate structure 23 and on the sidewall of the spacer layer 24); next, forming a nitride layer 252 on the first oxide cap layer 251; and further next, forming a second oxide cap layer 253 on the nitride layer 252. As such, the entire stacked cap layer 25 is formed. In other words, the stacked cap layer 25 includes the first oxide cap layer 251, the nitride layer 252 and the second oxide cap layer 253.

Figure 3C:
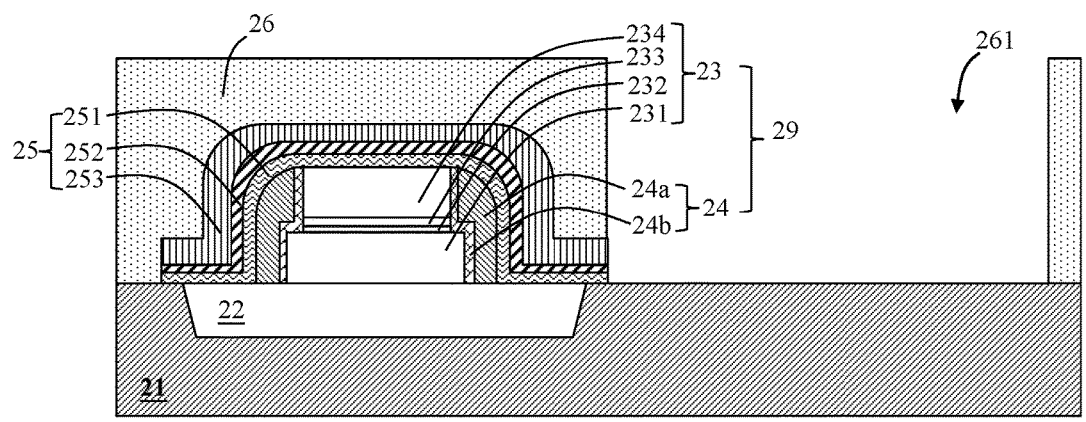

Next, as shown in FIG. 3C, a protection layer 26 is formed on the stacked cap layer 25, and the protection layer 26 is etched to form an opening 261. The material of the protection layer 26 of this embodiment and the method for forming the opening 261 of this embodiment are similar to those of the first embodiment, so their details are not redundantly explained here.

Figure 3D:
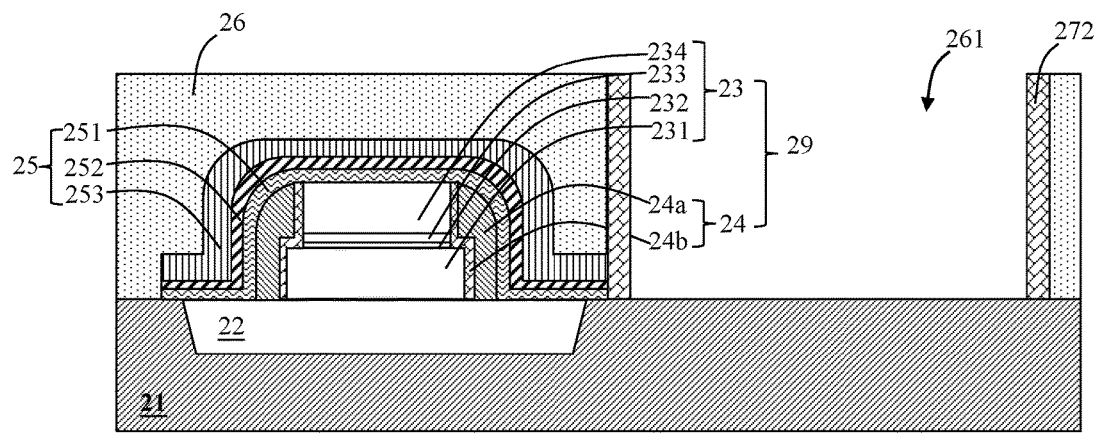

Next, as shown in FIG. 3D, an oxide protection layer 272 is formed on the sidewall of the opening 261.

Figure 3E:
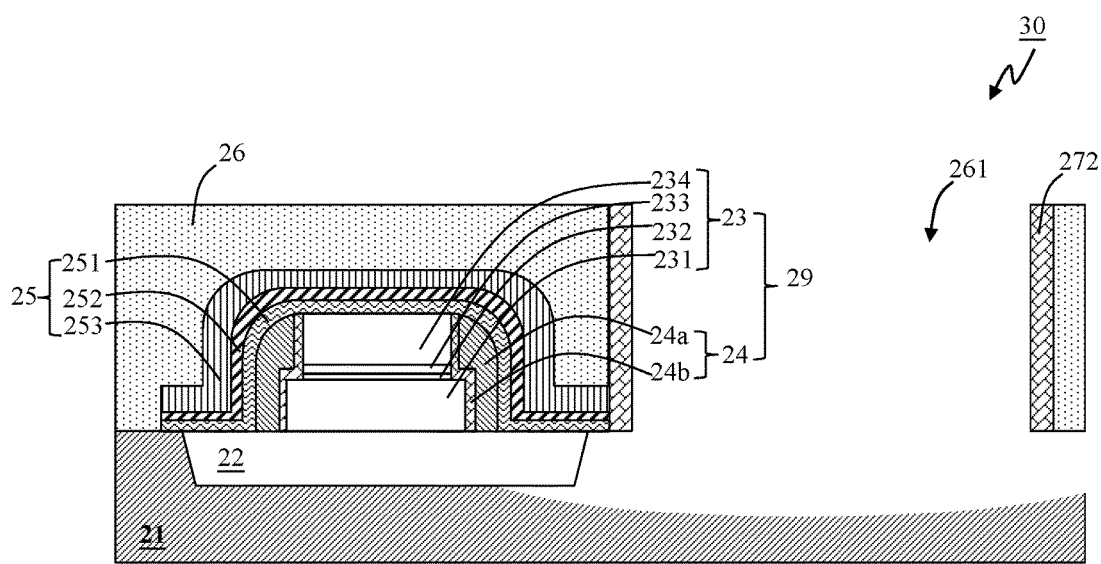

Next, as shown in FIG. 3E, an etchant material is introduced into the opening 261. In this embodiment, the substrate 21 is etched by isotropic etching, to form the configuration as shown in FIG. 3E. Thus, a semiconductor device 30 having a stacked cap layer 25 is obtained.

The etchant material of this embodiment is similar to that of the above-mentioned first embodiment, which can be a gas material or a liquid material. For example, the etchant material can be sulfur hexafluoride (SF6) or xenon difluoride (XeF2).

Figure 1B:
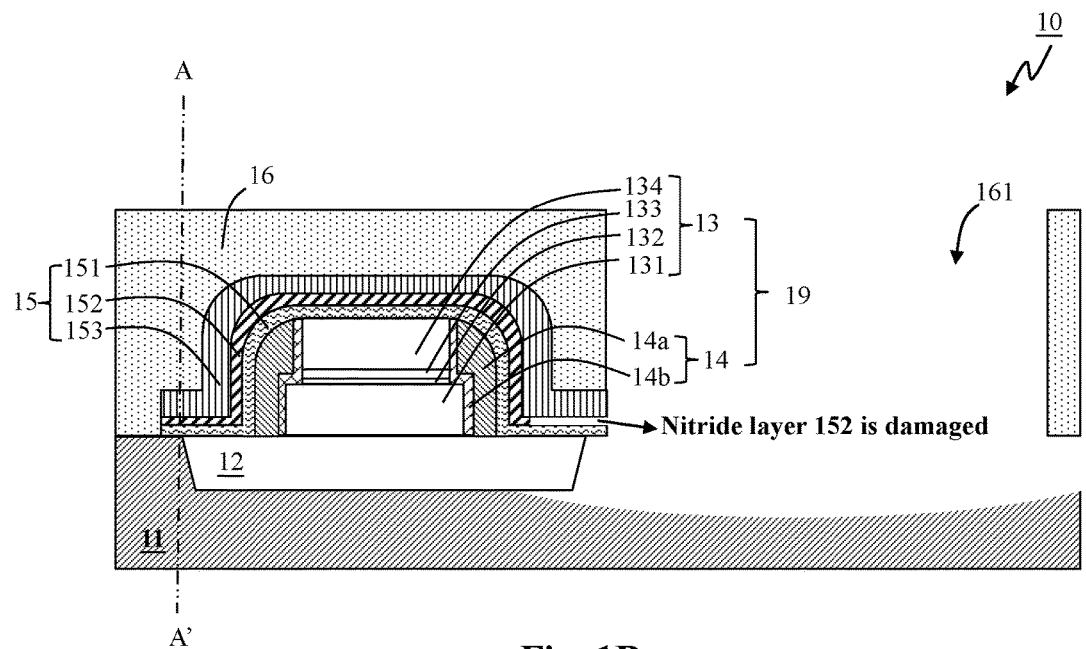

This embodiment is different from the prior art in that: in the prior art shown in FIG. 1B, the sidewall of the opening 261 is not covered by any material. In contrast, in FIG. 3D of this embodiment, because the oxide protection layer 272 (which is resistant to the etchant material sulfur hexafluoride (SF6) or xenon difluoride (XeF2)) is formed on the sidewall of the opening 261, the nitride layer 252 is protected, and the entire structure of the semiconductor device 30 is intact and robust.

In one embodiment, the manufacturing method for the semiconductor device of the present invention can be applied in manufacturing a temperature sensing device for use in an infrared temperature sensing module.

The present invention has been described in considerable detail with reference to certain preferred embodiments thereof. It should be understood that the description is for illustrative purpose, not for limiting the scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. In view of the foregoing, the spirit of the present invention should cover all such and other modifications and variations, which should be interpreted to fall within the scope of the following claims and their equivalents.

What is claimed is:

1. A manufacturing method for a semiconductor device, comprising the steps of:
   providing a substrate;
   forming a semiconductor stacked structure on the substrate;
   forming at least a part of a stacked cap layer on the semiconductor stacked structure, wherein the part of the stacked cap layer includes a nitride layer;
   removing a part of the nitride layer;
   forming the rest part of the stacked cap layer;
   forming a protection layer on the stacked cap layer, and etching the protection layer to form an opening, wherein the nitride layer is not exposed by the opening; and
   introducing an etchant material into the opening to etch the substrate.

2. The manufacturing method for the semiconductor device of claim 1, wherein the step of forming the semiconductor stacked structure on the substrate includes the sub-steps of:
   forming a shallow trench isolation (STI) structure on the substrate; and
   forming a gate structure and a spacer layer on the STI structure.

3. The manufacturing method for the semiconductor device of claim 2, wherein the step of forming the gate structure includes the sub-steps of:
   forming a first gate structure on the STI structure;
   forming a nitride dielectric layer on the first gate structure;
   forming an oxide dielectric layer on the nitride dielectric layer; and
   forming a second gate structure on the oxide dielectric layer.

4. The manufacturing method for the semiconductor device of claim 2, wherein the step of forming the spacer layer includes the sub-steps of:
   forming an oxide spacer layer outside a sidewall of the gate structure; and
   forming a nitride spacer layer outside a sidewall of the oxide spacer layer.

5. The manufacturing method for the semiconductor device of claim 1, wherein the step of forming at least the part of the stacked cap layer on the semiconductor stacked structure includes the sub-steps of:
   forming a first oxide cap layer on the semiconductor stacked structure; and
   forming a nitride layer on the first oxide cap layer.

6. The manufacturing method for the semiconductor device of claim 5, wherein the step of forming the rest part of the stacked cap layer includes the sub-step of:

forming a second oxide cap layer on the rest part of the nitride layer.

7. The manufacturing method for the semiconductor device of claim 1, wherein the etchant material includes sulfur hexafluoride (SF6) or xenon difluoride (XeF2).

* * * * *